(12) United States Patent
Knickerbocker et al.

(10) Patent No.: US 7,755,452 B2
(45) Date of Patent: Jul. 13, 2010

(54) POWER COMBINER

(75) Inventors: Howard Knickerbocker, Middlefield, MA (US); Frederick W. Hauer, Windsor, CT (US)

(73) Assignee: Coherent, Inc., Santa Clara, CA (US)

( * ) Notice: Subject to any disclaimer, the term of this patent is extended or adjusted under 35 U.S.C. 154(b) by 115 days.

(21) Appl. No.: 11/711,192

(22) Filed: Feb. 27, 2007

(65) Prior Publication Data

US 2008/0204134 A1 Aug. 28, 2008

(51) Int. Cl.
*H03H 7/38* (2006.01)
*H01P 5/12* (2006.01)
*H03F 3/68* (2006.01)

(52) U.S. Cl. .................. 333/131; 333/123; 333/119; 330/124 R; 330/295

(58) Field of Classification Search .................. 333/119, 333/123, 131; 330/124 R, 295; 372/38.02, 372/38.05, 38.07
See application file for complete search history.

(56) References Cited

U.S. PATENT DOCUMENTS

| | | | | |
|---|---|---|---|---|
| 4,311,965 A | | 1/1982 | Jones | 330/124 R |
| 4,885,557 A | * | 12/1989 | Barczys | 333/124 |
| 5,040,184 A | * | 8/1991 | Murray | 372/38.05 |
| 5,123,028 A | * | 6/1992 | Hobart et al. | 372/95 |
| 5,264,810 A | | 11/1993 | Sager et al. | 333/131 |
| 5,311,196 A | | 5/1994 | Hanson et al. | 342/368 |
| 5,434,881 A | | 7/1995 | Welsch et al. | 372/87 |
| 5,543,751 A | | 8/1996 | Stedman et al. | 330/124 D |
| 5,712,592 A | * | 1/1998 | Stimson et al. | 330/124 R |
| 6,018,280 A | * | 1/2000 | Makanvand | 333/137 |
| 6,323,742 B1 | * | 11/2001 | Ke | 333/127 |
| 6,384,540 B1 | * | 5/2002 | Porter et al. | 315/111.51 |
| 6,778,037 B1 | * | 8/2004 | Salmela et al. | 333/109 |
| 6,999,490 B2 | * | 2/2006 | Kennedy et al. | 372/55 |
| 7,164,903 B1 | * | 1/2007 | Cliff et al. | 455/327 |
| 2006/0192615 A1 | | 8/2006 | Fraysse | 330/124 R |

OTHER PUBLICATIONS

U.S. Appl. No. 60/810,538, filed Jun. 2, 2006, by W. Shef Robotham, Jr., et al., entitled "Transformer for impedance-matching power output of RF amplifier to gas-laser discharge," including Appendices A-B.
Book by Samuel Y. Liao, entitled Microwave Circuit Analysis and Amplifier Design, Chapter 5 "Balanced Amplifier Design and Power-Combining Techniques," published by Prentice-Hall, Inc. (Englewood Cliffs, New Jersey) [1987], pp. 161-192.
Ernest J. Wilkinson, "An N-Way Hybrid Power Divider," *IEEE Transactions on Microwave Theory and Techniques*, Jan. 1960, pp. 311-313.
E.J. Wilkinson, "An N-Way Hybrid Power Divider," *IRE Transactions on Microwave Theory and Techniques*, vol. MTT-08, Jan. 1, 1960, pp. 116-118.

* cited by examiner

*Primary Examiner*—Robert Pascal
*Assistant Examiner*—Kimberly E Glenn
(74) *Attorney, Agent, or Firm*—Morrison & Foerster LLP

(57) ABSTRACT

An RF power combiner used to combine an output received from a plurality of power amplifiers. The combined output is used to operate a gas discharge laser. In some embodiments, the power combiner consists of a network of transformers that provide an output to a load. In other embodiments, the power combiner consists of a plurality of transmission lines that are connected to a common connection point.

7 Claims, 9 Drawing Sheets

POWER COMBINER

TECHNICAL FIELD OF THE INVENTION

The present invention relates to laser systems and, in particular, to RF power combiners for use in RF solid state power supplies for medium power output diffusion cooled $CO_2$ slab lasers.

BACKGROUND

It is well known that for a fixed separation (D) between two rectangular electrodes having a width (W) and a length (L), the output power of a diffusion cooled $CO_2$ slab laser scales linearly with the area of the electrode. The optimum value of the separation D between the electrodes is predominately determined by the gas pressure, the laser's wavelength and the RF frequency of the power supply used to excite the discharge between the two electrodes. Typical gas pressure is about 50-150 Torr; typical wavelength is about 9-11 microns; typical frequencies are about 80-100 MHz. For these ranges of pressures and RF frequencies, the electrode separation D is about 0.05-0.13 inches. At these ranges of pressures, frequencies and electrode separation, the RF voltage applied to the discharge required to optimally operate a diffusion cooled $CO_2$ laser is approximately 225 Volts.

From the well known voltage, current, power relationship I=P/V, the current into the discharge for a constant voltage applied to the electrodes increases linearly with RF power into the discharge, as schematically illustrated by the solid straight line 10 in FIG. 1. From the well known power, voltage, impedance relationship $\mathbf{Z}=V^2/P$, the impedance of the discharge decreases as the inverse of the power as the RF power into the discharge is increased, as schematically illustrated by the dashed curved line 12 in FIG. 1.

Depending upon the laser's parameters, 50 ohms impedance for the discharge of a diffusion cooled $CO_2$ laser's output power typically occurs at about 100-150 W. Assuming 10% laser efficiency, this laser output power occurs for an input RF power into the discharge at about 1000-1500 W. Below this RF power range, the discharge impedance is generally higher then 50 ohms; above this power range, the discharge impedance is generally lower than 50 ohms. Consequently, the challenges in designing the solid state RF power amplifiers, power combiners and the impedance matching networks for effective power coupling into the discharge for the two situations are different.

Typically, solid state RF power combiners are designed to drive 50 ohms or higher loads, as in FM radio transmitters. Solid state RF power combiners for driving low impedance loads (i.e., <<50 ohms) are rather unique to medium and high power diffusion cooled $CO_2$ slab lasers.

The present invention provides RF solid state power combiners for driving low impedance loads (i.e. for driving medium power diffusion cooled slab laser discharges). The techniques disclosed herein also result in reducing the cost of handling the high currents in the power combiner portion of the solid state RF power supply that result from the low impedance levels as the power into the discharge increases. Realizing low impedance outputs in solid state power combiners is important in efficiently utilizing solid state devices in RF power supplies for driving the low impedance of medium to high power diffusion cooled $CO_2$ lasers in order to reduce cost and enhance laser efficiency. As the laser output power increases, a laser power is finally reached where the use of vacuum tube technology is required in order to provide a cost effective laser product. It is believed that the laser power level requiring a transition from solid state to vacuum tube technology for the RF power supply is above 1000 W if the inventive techniques disclosed herein are utilized.

FIG. 2 shows a schematic of the general conventional approach used in solid state RF power supplies for driving diffusion cooled $CO_2$ gas lasers. As an example, the FIG. 2 circuit 20 is configured for a 6 KW output if four 300 W transistors (i.e. Philips BLF 278A) are used in each of the five power amplifiers ($PA_1$-$PA_5$) 22. Constituting each power amplifier 22 is a set of two transistors arranged in a push/pull amplifier configuration. Two of the push/pull amplifiers are arranged in a binary power combiner configuration, as is well known in the state of the art, to form a power amplifier. Conservatively allowing for circuit losses, the approach illustrated in FIG. 2, with the specified transistors and five power amplifiers 22, is sufficient to drive a $CO_2$ laser having approximately 500 W or higher average output power. Driving the power amplifiers 22 in a pulsed mode of operation at duty cycles ($C_y$) less than unity can yield RF peak power output ($P_p$) equal to the continuous wavelength (CW) average power ($P_a$) divided by $C_y$. In this pulsed case, the impedance of the laser discharge ($\mathbf{Z}_L$) is lower than in the CW case, due to it being more highly driven.

The approach shown in FIG. 2 begins with a transistor oscillator 24 having the desired frequency (e.g., 100 MHz). The output of the oscillator 24 is fed to a preamplifier chain ($P_rA$) 26 such that the output power of the preamplifier $P_rA$ is sufficiently large to drive the five power amplifiers ($PA_1$-$PA_5$) 22 into non-linear operation for maximum efficiency, as is well known in the art. The inputs to each of the power amplifiers ($PA_1$-$PA_5$) 22 have equal amplitude and equal phase RF signals to obtain approximately 1200 W of output RF power from each of the five power amplifiers 22, thereby yielding a total output average power output of 6000 W. The output of each of the power amplifiers 22 is fed to an associated directional coupler (DC) 28, the design of which is also well known to those skilled in the art. The signals from the directional couplers ($DC_1$-$DC_5$) 28 are used to measure the forward power (FP) to the discharge as well as the back-scattered power (BP) from the laser discharge.

The forward power signal FP from the directional couplers ($DC_1$-$DC_5$) 28 of the FIG. 2 circuit 20 is used to determine/monitor the output performance of the individual power amplifiers 22 to diagnosis operational problems, if any, such as: are the power amplifiers 22 putting out equal power. The backward scattered power detected by the collection of directional couplers ($DC_1$-$DC_5$) 28 in the FIG. 2 circuit 20 is used to monitor how well the power supply is matched to the laser's discharge (i.e. the load). When the discharge is unlit, the discharge impedance is very high (i.e. little or no current is flowing through the discharge) and a large percentage of the power is reflected back toward the oscillator due to the large impedance mismatch. When the back-scattered power (BP) is large, the large BP signal is used to turn off the power supply to protect it from damage. A pre-igniter is usually used to ignite the discharge (not shown in FIG. 2 for simplicity) and to keep it lit so significant back reflected power does not occur. U.S. Pat. No. 5,434,881 issued on Jul. 18, 1995, discloses an igniter assembly example on a $CO_2$ diffusion cooled slab laser.

There are numerous ways to implement the back reflection protection circuits which are well known to those skilled in the art. Therefore, such a circuit is not shown in FIG. 2. When the discharge is lit, the impedance is low and by design the RF power supply is made to match the lit discharge impedance so that the reflected power is low or zero.

As further shown in FIG. 2, the output of each of the directional couplers ($DC_1$-$DC_5$) 28 is provided to a corresponding impedance matching network ($IMN_1$-$IMN_5$) 30 which is used to match the input impedance of each of the power amplifiers 22 to the impedance of the power combiner (PC) 32. In the prior art, the input impedance of the power combiner 32 is usually made to be 50 ohms. There are numerous well known means to those skilled in the art for accomplishing this impedance match between the power amplifiers 22, the directional couplers 28 and the power combiner 32 by the impedance matching network 28. One common approach is to use a step-up transformer of the type disclosed in U.S. Provisional Application No. 60/810,538, filed on Jun. 2, 2006, by W. S. Robotham Jr., Frederick W. Hauer and Leon A. Newman; Application No. 60/810,538 is hereby incorporated by reference herein.

The power combiner 32 and the final impedance matching network ($IMN_f$) 34 placed before the laser discharge 36 of the FIG. 2 circuit 20 are one of the most difficult items in the design of an efficient RF solid state power supply to drive a diffusion cooled $CO_2$ slab laser having several hundred watts and higher of output power because of the high currents coming together into and leaving the power combiner 32 and the final impedance matching network ($IMN_f$) 34. For commercial applications, the power combiner 32 needs to have as few components as possible for reduced cost. In the prior art for the RF solid state power supplies, the cost of the supply was approximately equal to ½ the cost of the entire laser. The present invention provides techniques for reducing this cost ratio.

To those skilled in the art, there are numerous well known approaches available for designing the power combiner (PC) and the final impedance matching network ($IMN_f$). (See, for example, Microwave Circuit Analysis and Amplifier Design, Chapter 5; Samual V. Liao; Prentice Hall, Inc. pp 161-192). One known approach for the power combiner (PC) is to use the "Wilkinson" power combiner/divider ("An N-Way Hybrid Power Divider" by Ernest J. Wilkinson; IRE Transactions on Microwave Theory and Techniques, January 1960, pp. 311-313: see also pp. 183-184 of the Liao publication). Another known approach is the "binary" power combiner/divider structure as discussed in FIG. 5-4-1 on page 174 of the Liao publication.

The present invention provides two power combiner designs based upon modifications to the above-mentioned Wilkinson and binary PC designs and one completely new broadband preferred power combiner design for realizing an efficient, low cost power combiner to impedance match low impedance loads associated with medium power diffusion cooled $CO_2$ slab lasers over the prior art. A brief discussion of the Wilkinson and the binary power combiners is provided below in order to fully appreciate the merits of the present invention. These two previous approaches are the approaches presently used to impedance match the RF power supply to the discharge impedance of diffusion cooled $CO_2$ lasers that have output powers below 150-200 Watts. These lower power lasers have higher impedances, e.g., around 50 ohms and higher, than possessed by medium and higher power $CO_2$ lasers, as stated above. The present invention reduces the cost of solid state RF power combiners for driving the discharges of diffusion cooled slab lasers having output powers above 150-200 hundred watts and, therefore, having input impedances much lower than 50 ohms. It is important to note that the concepts of the present invention are also applicable to lower power $CO_2$ lasers of either the wave guide or slab laser configuration.

FIG. 3 schematically illustrates a conventional 4-way binary power combiner 40 that is well known to those skilled in the art. The FIG. 3 example has a 50 ohm input from four separate power amplifier sources ($PA_1$-$PA_4$) 42 that have equal amplitudes and phases and delivers an RF output to a 50 ohm load. In this example, the four power amplifiers 42 are shown each having 50 ohm input, and output as is typical in the prior art approaches, using the transistors referenced above. This arrangement provides 5 KW of output power at 100 MHz. A 100 ohm resistor 44 is connected between the outputs of power amplifier $PA_1$ and power amplifier $PA_2$ and between power amplifier $PA_3$ and power amplifier $PA_4$ to dissipate any unbalanced power. These resistors 44 are known as difference resistors or balancing resistors to those skilled in the art. The outputs of power amplifiers $PA_1$/$PA_2$ and power amplifiers $PA_3$/$PA_4$ are combined by the 1:1 ratio transformers $T_1$ and $T_2$ respectfully. The transformers $T_1$ and $T_2$ convert the impedances to 25 Ohms at their respective outputs. A 50 ohm difference resistor 46 is connected between the output of transformer $T_1$ and the output transformer $T_2$, thereby providing a 12.5 ohms output impedance at the 1:1 transformers $T_3$ output. The standard practice has been to match this 12.5 ohm to a 50 ohm load $Z_L$ as shown in FIG. 3. One commonly used approach to accomplish this impedance matching transition is to use a 1:2 step-up transformer $T_4$ to convert the 12.5 Ohm to 50 Ohm to match the load ($Z_L$) 48. These transformers and resistors are high power devices and, therefore, expensive items.

FIG. 4 illustrates a conventional 4-way Wilkinson combiner 50, again typically having 50 ohm input and output. In this case, four one quarter wavelength co-axial transmission lines 52 are used, each having a 50 ohms characteristic impedance to provide the power combining. Micro strip transmission lines can be and are also often used instead of the co-axial transmission line shown in FIG. 4. The ends of the outer conductor of each of the co-axial transmission lines 52 are attached to electrical ground as shown. One end of each of four resistors 54, each having a value of 50 ohms, is connected to one of the input inner conductors of the four co-axial transmission lines as shown, with the opposite end of each resistor connected to a common electrical connection point. These resistors 54 are the difference or balancing resistors. Each of the four center conductors, at the end of each of the transmission line 52, are connected to another common electrical connection point yielding a 12.50 ohms output impedance. In this prior art example, it is usually desired to connect the common connection point to a 50 Ohms load located some distance away. This is typically accomplished by the use of a λ/4 length, or a multiple ¼ wave length co-axial cable having 25 ohm characteristic impedance, as shown in FIG. 4. The use of ¼ wavelength transmission lines makes this technology narrow band in comparison to the approach of FIG. 3. The balancing resistors are again high cost items.

Variations of the power combiners shown in FIGS. 3 and 4 can be and are used to drive diffusion cooled $CO_2$ lasers having output powers between tens to over 500 watts by adding an impedance matching network ($IMN_f$) in front of the discharge connection and adjusting the $IMN_f$ components so that the impedance looking into the $IMN_f$ from either of the power combiners of FIG. 3 or 4 is 50 Ohms. The use of such prior art power combiner technologies results in the cost of the RF power supply being approximately equal to the cost of the laser head. The present invention reduces this cost ratio between the RF power supply and the laser head.

For example, elimination of the output impedance transformer $T_4$ in the FIG. 3 power combiner would result in significant cost reduction. In addition, the low output impedance of 12.5 ohms out of the transformer $T_3$ is more closely matched to the low input impedance of the discharge of a medium output power laser. For example, the discharge impedance of a 500 W laser is likely to be about 6 ohms. This closer impedance match also reduces the cost of the $IMN_f$ required to match the 12.5 ohms output of the power combiner to the 6 ohms impedance of the discharge. High power RF transformers are expensive and present additional power losses in the power delivery circuits, thereby reducing the wall plug efficiency of the laser.

The high power λ/4 transmission line impedance transformers shown in the FIG. 4 power combiner likewise present additional losses and packaging challenges due to the lengths and diameter of the co-axial line or the need for properly cooling it. Operating at low output impedance for the power combiner results in a lower circuit Q which results in decreased circulating current losses in the impedance matching circuit ($IMN_f$) between the combiner output and the laser discharge.

DETAILED DESCRIPTION

Figure 5:
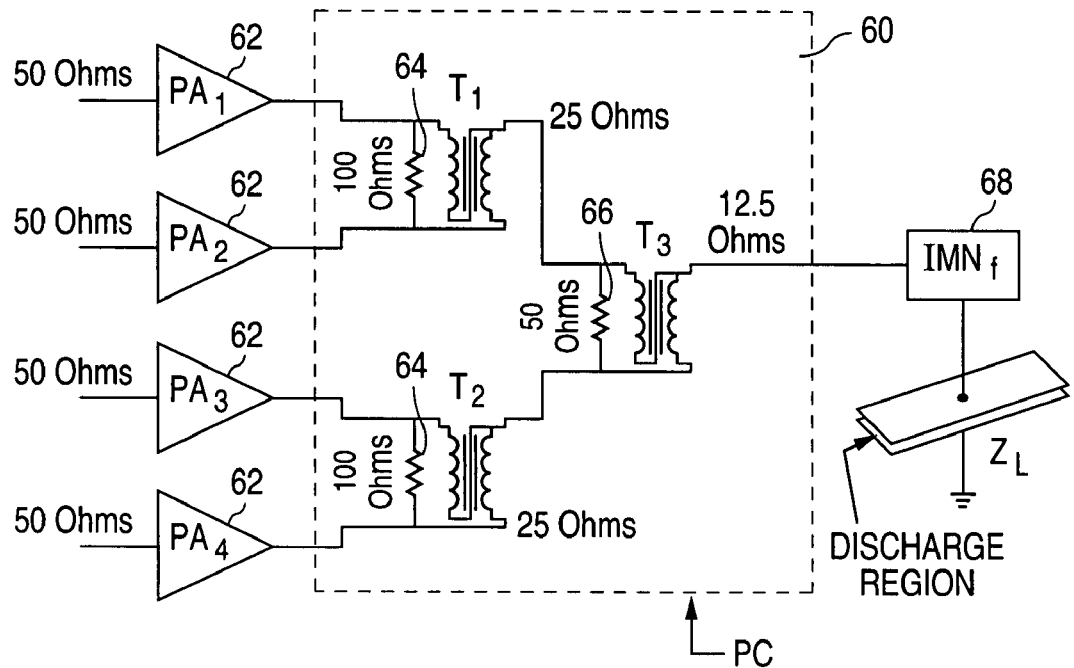
FIG. 5 is a schematic diagram illustrating a 4-way power combiner in accordance with an embodiment of the present invention.

FIG. 5 illustrates a modified 4-way binary power combiner 60 in accordance with the concepts of the present invention that can be cost effectively used to drive low discharge impedances. The 4-way embodiment shown in FIG. 5 provided only as an example and should not be considered as limiting the invention. Those skilled in the art will appreciate that other multi-way binary power combiner embodiments are within the spirit and scope of the invention.

Figure 3:
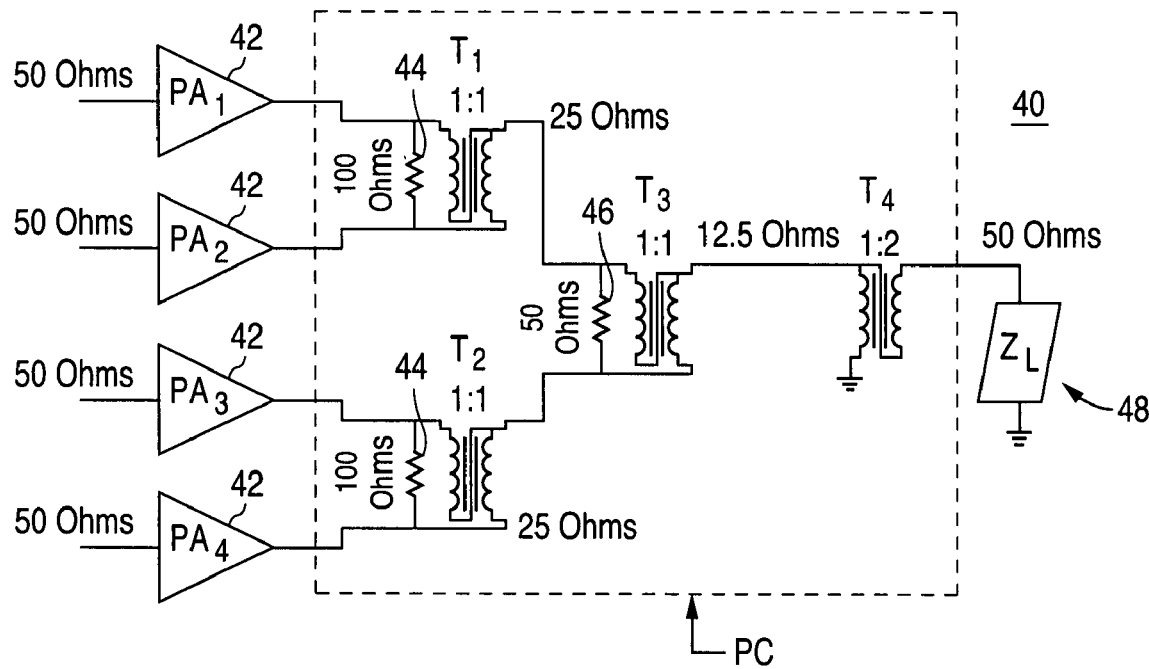
FIG. 3 is a schematic diagram illustrating a conventional binary 4-way power combiner.

Comparing the FIG. 3 power combiner 40 and the FIG. 5 power combiner 60 of the present invention shows that transformer $T_4$ is eliminated from the FIG. 3 circuit 40 to obtain the FIG. 5 circuit 60. That is, as shown in FIG. 5, and as in the FIG. 3 circuit 40, the power combiner 60 receives a 50 ohm input from four separate power amplifier sources ($PA_1$-$PA_4$) 62 that have equal amplitudes and phases and deliver an RF output to a 50 ohm load. A 100 ohm resistor 64 is connected between the outputs of power amplifier $PA_1$ and power amplifier $PA_2$ and between power amplifier $PA_3$ and power amplifier $PA_4$. The outputs of power amplifiers $PA_1$/$PA_2$ and power amplifiers $PA_3$/$PA_4$ are combined by 1:1 ratio transformers $T_1$ and $T_2$ respectively. The transformers $T_1$ and $T_2$ convert the impedances to 25 Ohms at their respective outputs. A 50 Ohm difference resistor 66 is connected between the output of transformer $T_1$ and the output of transformer $T_2$, thereby providing 12.5 Ohm output impedance at the output of transformer $T_3$. This provides the power combiner 60 with 12.5 ohms output impedance that is fed directly to the impedance matching network ($IMN_f$) 68. The impedance matching network $IMN_f$ can consist of a $P_i$ (π) network of two capacitors and an inductor, or other impedance matching networks known to those skilled in the art. The $IMN_f$ is efficient because only a small amount of impedance adjustment is needed to achieve a match between 12.5 ohms and 6.0 Ohms match. Note that there is no transmission line connecting the output of the power combiner 60 to the $IMN_f$, so the connections between the output of transformer $T_3$ and $IMN_f$ and the $IMN_f$ and the lasers electrodes needs to be made in a short distance. The details of how this short connection can be accomplished are described below in conjunction with FIG. 8. This modified binary power combiner design has a lower part count and lower cost advantage over the conventional design shown in FIG. 3.

Figure 6:
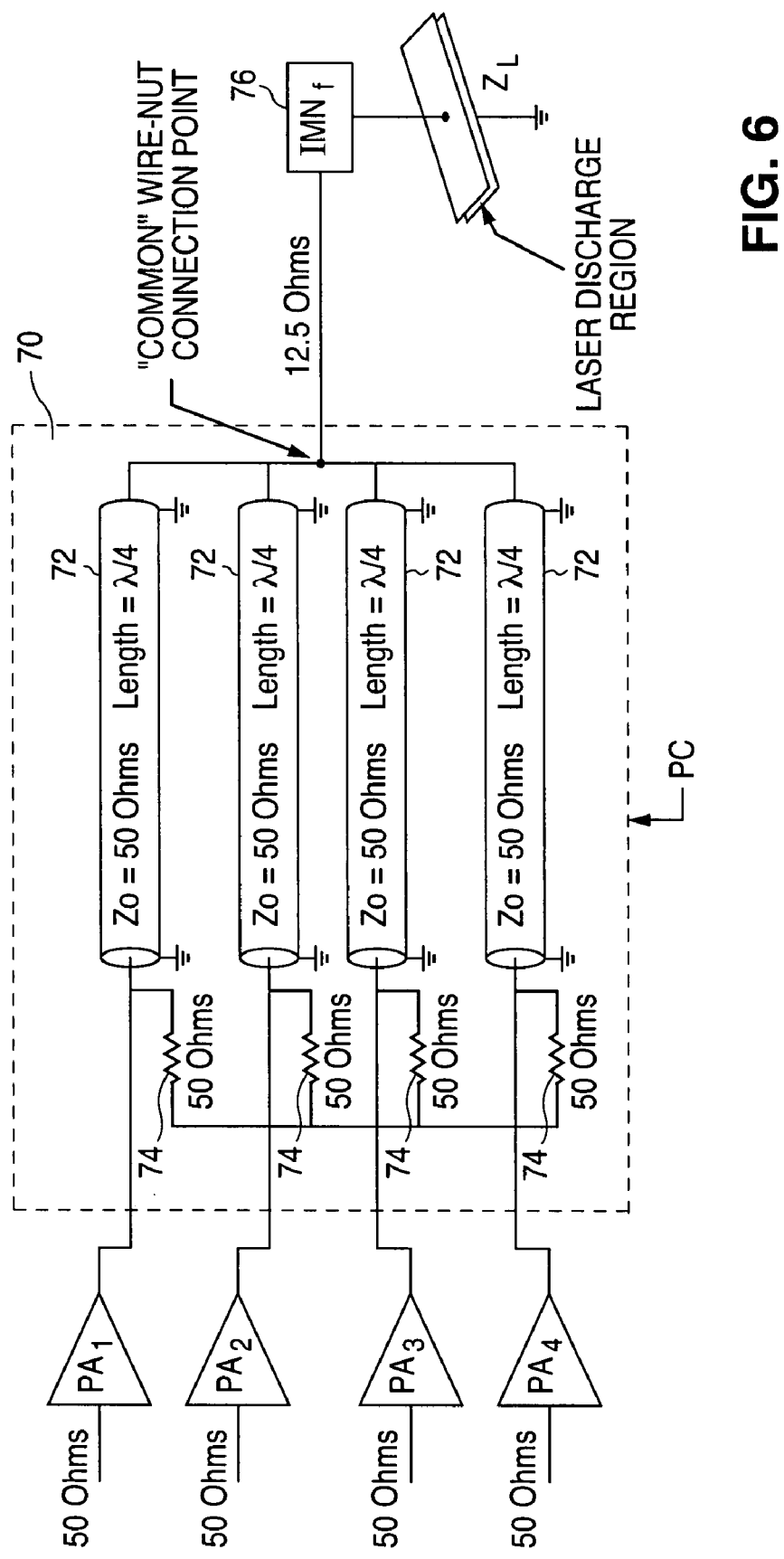
FIG. 6 is a schematic diagram illustrating a 4-way Wilkinson power combiner in accordance with an embodiment of the present invention.

FIG. 6 illustrates a modified 4-way Wilkinson power combiner 70 in accordance with the concepts of the present invention with 50 ohms input and 12.5 ohms output that is suitable for driving low impedance discharges. Comparing the FIG. 6 design 70 and the conventional FIG. 4 design 50 shows that the co-axial transmission line transformer connecting the power combiner to the load is eliminated. This provides the FIG. 6 power combiner 70 with 12.5 ohm output impedance and a part count/cost savings advantage.

Figure 4:
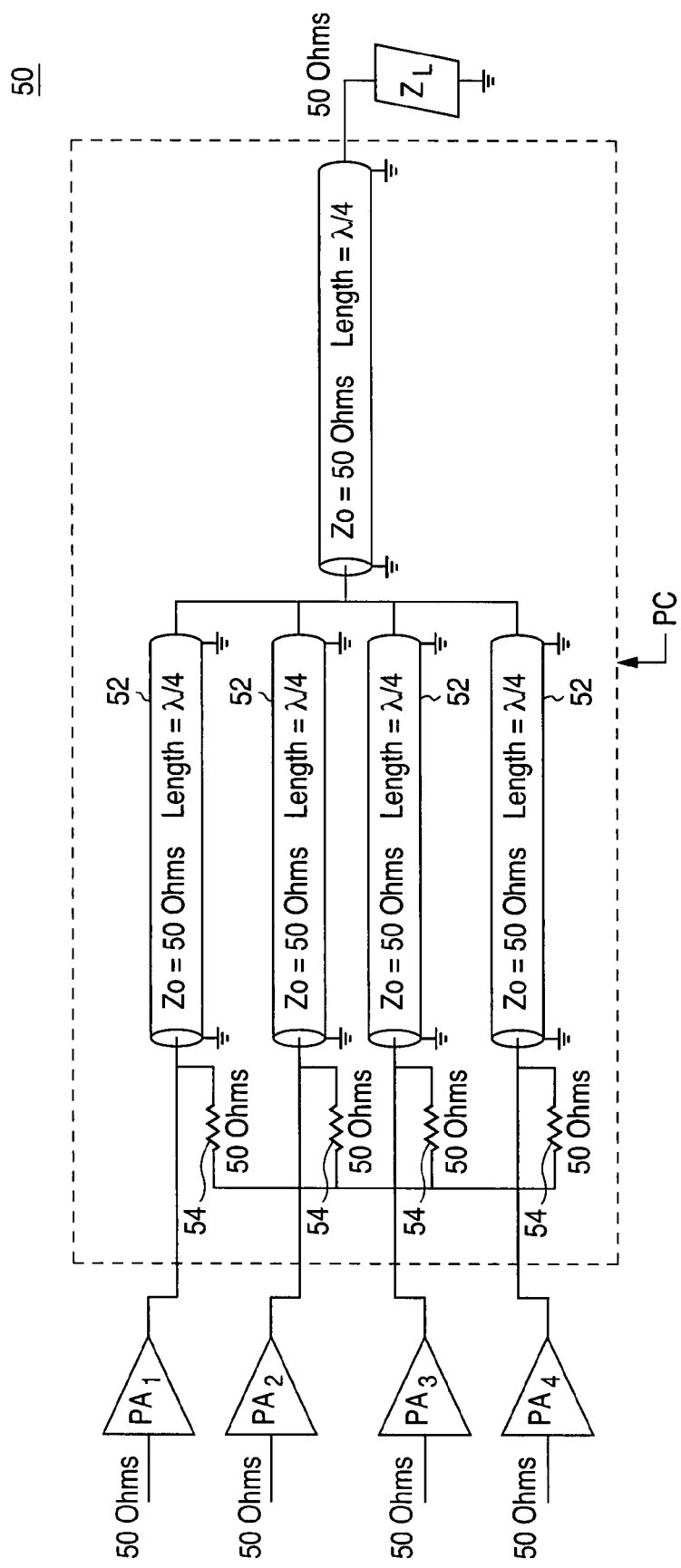
FIG. 4 is a schematic diagram illustrating a conventional 4-way Wilkinson power combiner.

As shown in FIG. 6, and as in the FIG. 4 circuit 50, four one quarter wavelength co-axial transmission lines 72 are used, each having 50 ohms characteristic impedance to provide the power combining. The ends of the outer conductor of each of the co-axial transmission lines 72 are attached to electrical ground. One end of each of four 50 ohm resistors 74 is connected to one of the input inner conductors of the four co-axial transmission lines 72; the opposite end of each resistor 74 is connected to a common electrical connection point. Each of the four center conductors at the end of the co-axial transmission lines 72 is connected to a common electrical connection point yielding a 12.5 ohms output impedance. The 12.5 ohms output of the power combiner 70 is fed directly to the impedance matching network ($IMN_f$) 76 and then to the laser discharge, in a manner similar to that of the FIG. 5 design. The short connection between the output of the power combiner 70 and the $IMN_f$ and the $IMN_f$ and the laser electrodes can also be made as shown in FIG. 8. The quarter wavelength transmission lines 72 provide the FIG. 6 power combiner with a much narrower bandwidth than available with the power combiner shown in FIG. 5. This approach has a lower cost than the FIG. 5 power combiner.

Figure 7:
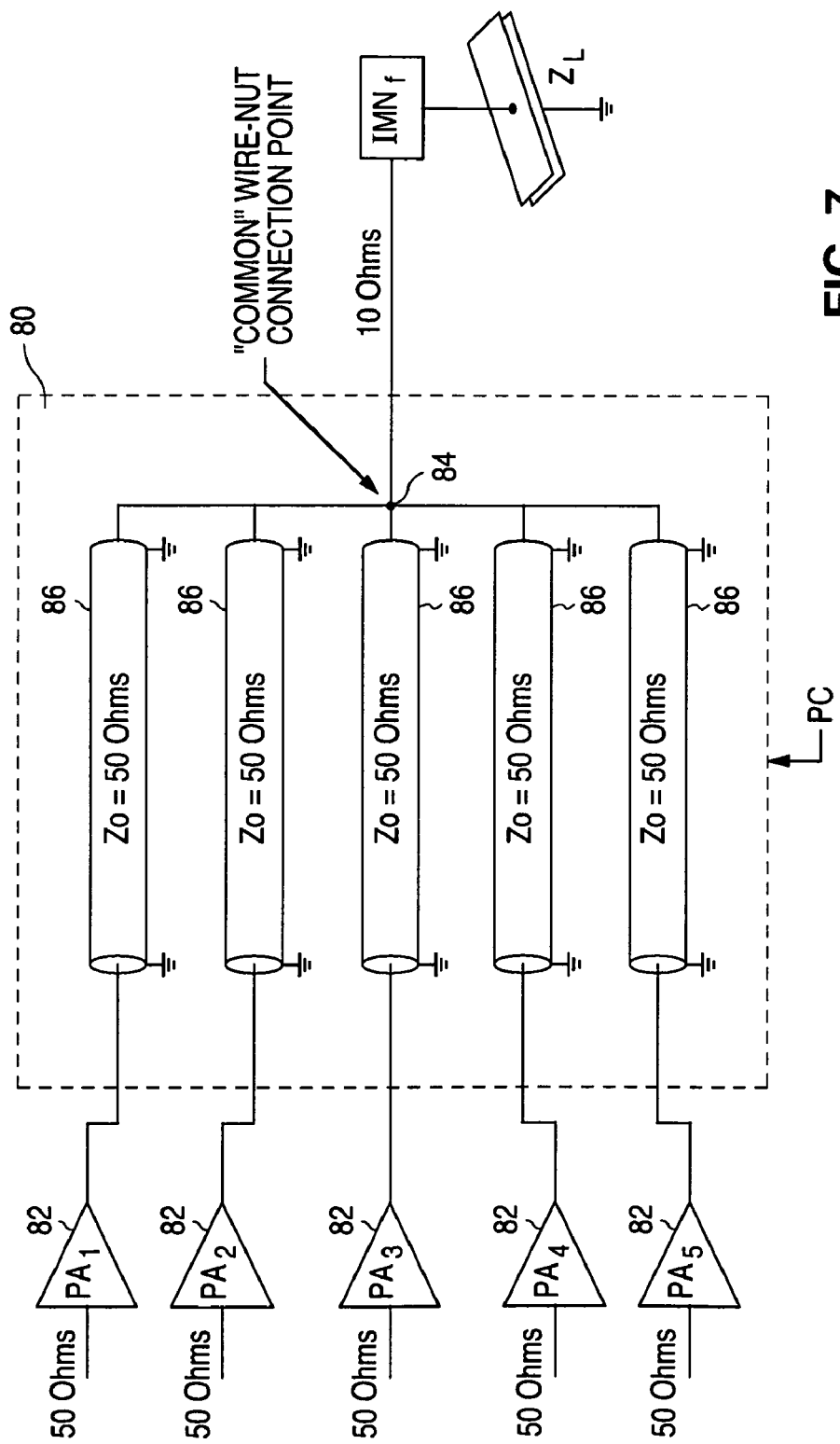
FIG. 7 is a schematic diagram illustrating an alternate embodiment of a RF power combiner in accordance with the present invention.

FIG. 7 shows a preferred power combiner 80 for driving a low impedance diffusion cooled slab laser discharge. Comparing the FIG. 7 design 80 with the PC approaches of FIGS. 5 and 6 shows that this approach is simpler, has fewer components and, therefore, has lower cost. Since it does not require one quarter wavelength transmission lines, it also has wider bandwidth then the FIG. 6 design. The FIG. 7 power combiner 80 should therefore have wider applicability than just driving laser discharges. Once such application could be in communication transmitters driving antennas.

It is estimated that a RF power supply using the power combiner 80 shown in FIG. 7 would have approximately 40% less cost than a power supply using the PC's shown in either FIG. 3 or FIG. 4. This un-conventional, low-cost, broad band 4-way combiner is uniquely applicable for use with solid state RF amplifiers used in $CO_2$ laser power supplies. This new combiner can be used in the pulsed RF power supply driving a super pulse 400 watt laser. It can be used to drive either continuous wavelength (CW) or pulsed $CO_2$ lasers.

This un-conventional power combining approach is much less costly to manufacture, but it provides less control of individual amplifiers load impedances than the power combiners of FIGS. 5 and 6. It has been found by testing that the control of individual amplifiers load impedances in a 5-way power combiner is good enough for driving low impedance discharges. Discharges have been driven where N was equal to 5.0 with excellent results. Computer simulations of the behavior of the FIG. 7 power combiner 80 when the inputs were deliberately unbalanced also indicated that the control is more than sufficient. It has been experimentally found that failure of adjacent amplifiers did not occur in a 6000 watt prototype when one amplifier out of the five amplifiers was made to intentionally experience a partial failure.

It is prudent to have the power amplifiers ($PA_1$-$PA_5$) 82 in the power combiner 80 of FIG. 7 to have their output power and output impedance typically matched within 10% in order to minimize the additional dissipation and waveform distortion imposed on adjacent power amplifiers. Since impedance matching is normally performed for all power combiners for optimum operation, this does not place an unusual burden on the FIG. 7 design.

For the 5-way combiner 82 shown in FIG. 7, with the summing node 84 properly terminated as shown, computer simulation has shown that a 50% power reduction of one power amplifier 82 results in the effective load impedances seen by the other four remaining power amplifiers 82 within 1.3:1 voltage standing wave ratio (VSWR). This is very acceptable and capable of being handled by the low internal losses of the high peak power transistors.

Experiments have indicated that complete failure of one of the four transistors making up one power amplifier 82 results in the effective load impedances seen by the four remaining power amplifiers 82 within 2:1 voltage standing wave ratio (VSWR) as long as each of the other 3 transistors within the damaged power amplifier are well matched in terms of output power.

As illustrated in FIG. 7, a typical embodiment will use Zo=50 ohms transmission lines 86 for all combiner inputs with all transmission lines 86 having the same length. The summing node impedance is then Zo/N. For N=5, the summing node impedance is 10 ohms as shown in FIG. 7. This preferred power combiner approach does not require difference (i.e. balancing) resistors to dissipate unbalanced amplifier output power. The length of the 5 transmission lines 86 is not important, but, as stated above, they must all be the same length in order to maintain equal phase shift at the combining node. The FIG. 7 power combiner 80 can, therefore, be implemented at significantly lower cost and complexity than the modified conventional power combining designs of FIGS. 5 and 6.

As discussed above with respect to FIGS. 5 and 6, the low output impedance naturally obtained with this preferred PC embodiment also makes it easier to match the $IMN_f$ RF input impedance to both the $CO_2$ laser discharge and the PC output impedance.

From a cost and laser efficiency stand point, it is desirable to have the RF power supply mounted directly on the laser tube housing. Such a mounting is especially desirable for mounting the laser directly on a robotic arm because it eliminates the RF semi-flexible power cable which tends to break under numerous flexing. Mounting the RF power supply directly on the laser tube housing requires that the distance between the output of the power-supply and the laser discharge connection be short (i.e. between the output between the PC's common node electrical connection points of FIG. 6 and of FIG. 7, and the RF connection to the electrodes within the laser enclosure containing the electrodes, mirrors of the optical resonator, and the $CO_2$:N2:He gas mixture) for the PC embodiments of FIGS. 5, 6 and 7. An added advantage of mounting the power supply on the laser tube is that liquid cooling of both the laser tube and the RF power supply is more easily facilitated and implemented at less cost. There are numerous means of realizing this short RF connection between the PC out put and the laser electrodes.

Figures 8A, 8B:
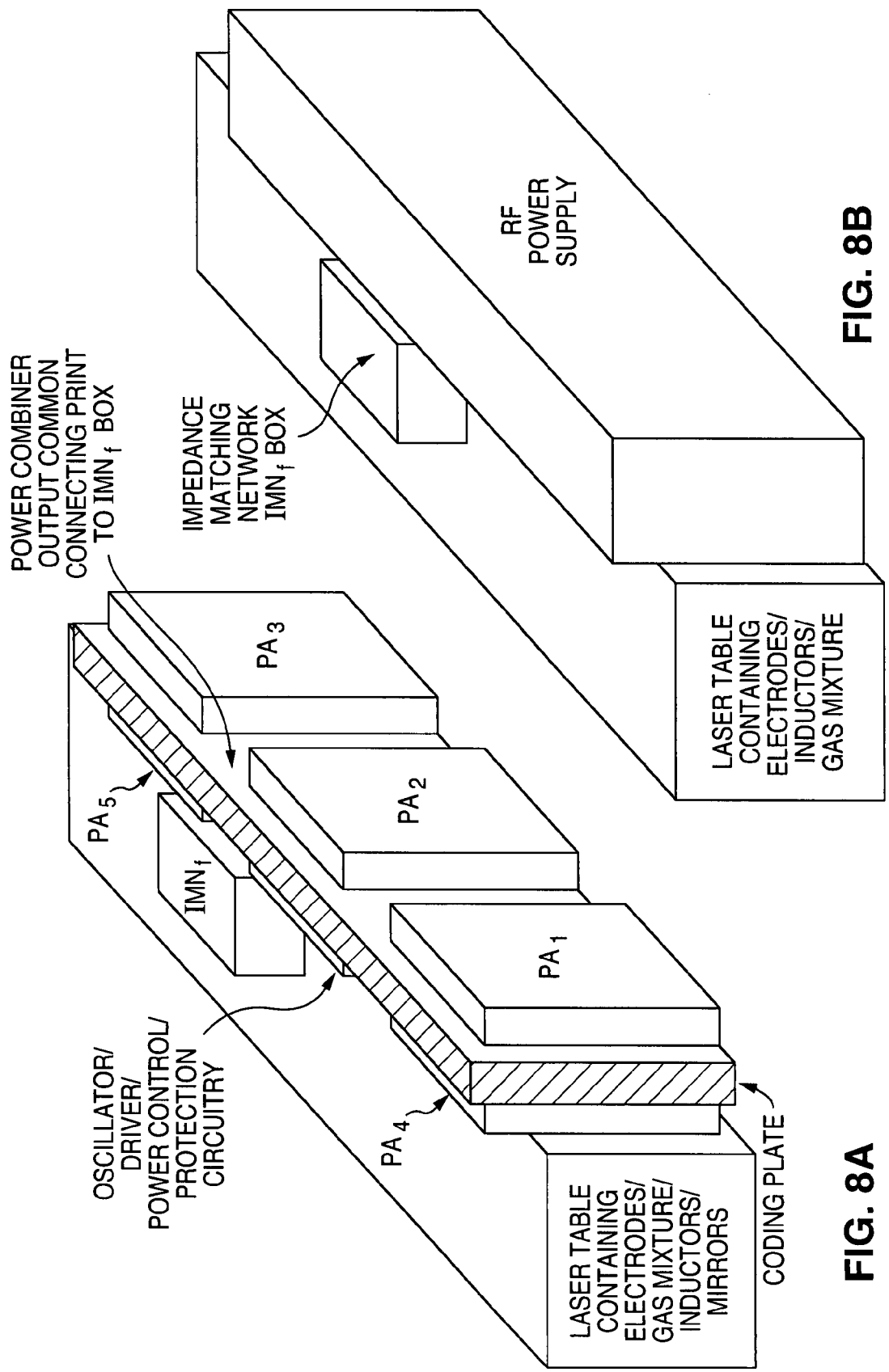
FIGS. 8A and 8B are perspective drawings illustrating the packaging of a power combiner in accordance with the present invention.

FIG. 8A schematically presents an over-view of one preferred packaging arrangement for mounting the RF power supply onto the laser tube that contains the gas mixture, the inductors, the electrodes and the optical resonator. FIG. 8B shows more details of an RF power supply package incorporative either of the power combiners illustrated in FIG. 5, 6 or 7. This is the preferred general packaging approach for a 500 W laser. As shown in FIG. 8A, the power supply uses five power amplifier printed circuit boards (PCBs) with three PCBs mounted on one side of a cooling plate and two PCBs mounted on the opposite side along with another PCB for the oscillator/driver circuit. This sixth board can also contain the power control and protection circuitry subsystem shown in FIG. 9. Each power amplifier PA board has four power transistors, as well as the directional couplers DC and the IMNs, as discussed above.

In the embodiments of the invention described above, the length of a λ/4 Teflon 50 ohm co-axial cable is in the neighborhood of 20 inches (i.e. 51 cm); the length of the $CO_2$ laser tube is 30 cm long. Consequently, the length of the co-axial cables is sufficient for bringing the ends of all of the 50 ohm cables from each of the printed circuit boards to a common node point for connecting to the impedance matching network within the $IMN_f$ box shown in FIG. 8B. The preferred $IMN_f$ circuit used is a two capacitor/one inductor network in a $P_i$ (π) configuration. Other network configurations could also be used, such as a one inductor/one capacitor network in an L configuration. Impedance tuning adjustments are made by primarily adjusting the value of the capacitors. The output of the $IMN_f$ is connected to the nearest metal laser electrode within the laser tube housing. The width dimension of the two parallel metal laser electrodes that are separated by distance "D" are positioned vertically within the laser tube housing. The lengths of the parallel electrodes lies along the length of the laser tube housing. The opposite laser electrode is connected to the metal housing of the laser tube housing which serves as electrical ground. The electrical grounding of the laser tube containing the RF discharge prevents stray RF radiation from escaping outside the laser tube.

The FIG. 7 embodiment of the invention has the lowest cost, but less balance protection and the widest bandwidth over the approaches shown in FIGS. 5 and 6. This wide bandwidth feature is attractive for applications that require large bandwidths, such as in communication transmitters driving antennas applications. It is well known that the optimum discharge ignition Rf frequency is different from the optimum Rf frequency required to operate the discharge efficiently once it is lit. The large bandwidth feature of the power combiner of FIG. 7 makes it attractive for handling this different frequency feature.

The FIG. 6 embodiment is more costly to implement than the FIG. 7 embodiment, but offers better balance protection. Its narrow bandwidth feature is a disadvantage in its ability in handling the difference in the optimum ignition and CW operation frequency. Fortunately, the extra balance protection is not needed in the laser discharge driving application. Data indicates that the approach illustrated by FIG. 7 offers more than sufficient balance protection for the intended applications of driving low impedance CO2 laser discharges.

The FIG. 5 (i.e. the modified binary PC) embodiment is the most expensive to implement for driving diffusion cooled $CO_2$ slab lasers in the medium output power range of a few hundred to one kilowatt. The increased expense is mostly associated with the transformers.

Figure 1:
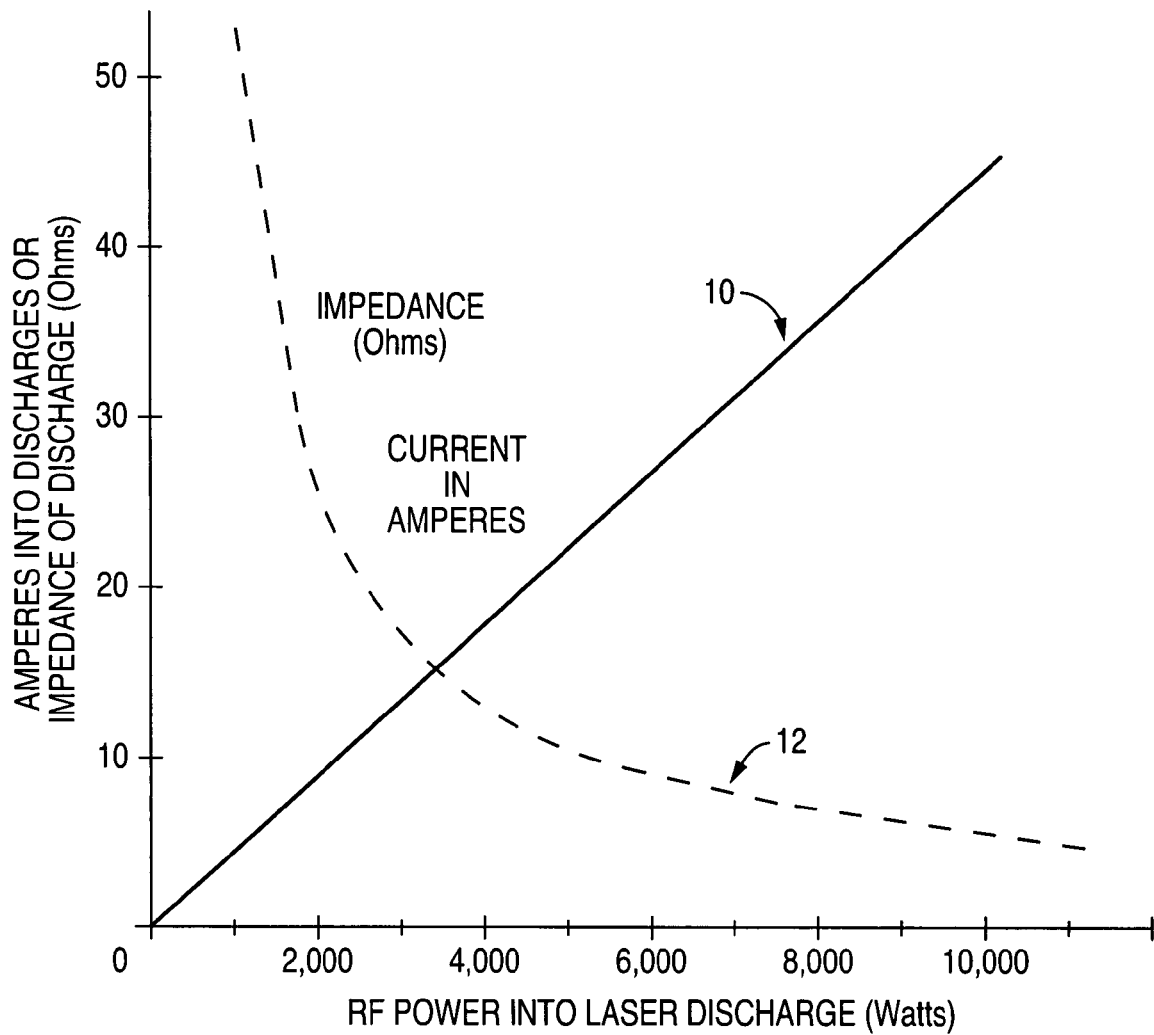
FIG. 1 is a plot showing general current and impedance behavior as a function of RF power into diffusion cooled $CO_2$ laser discharges.
Figure 2:
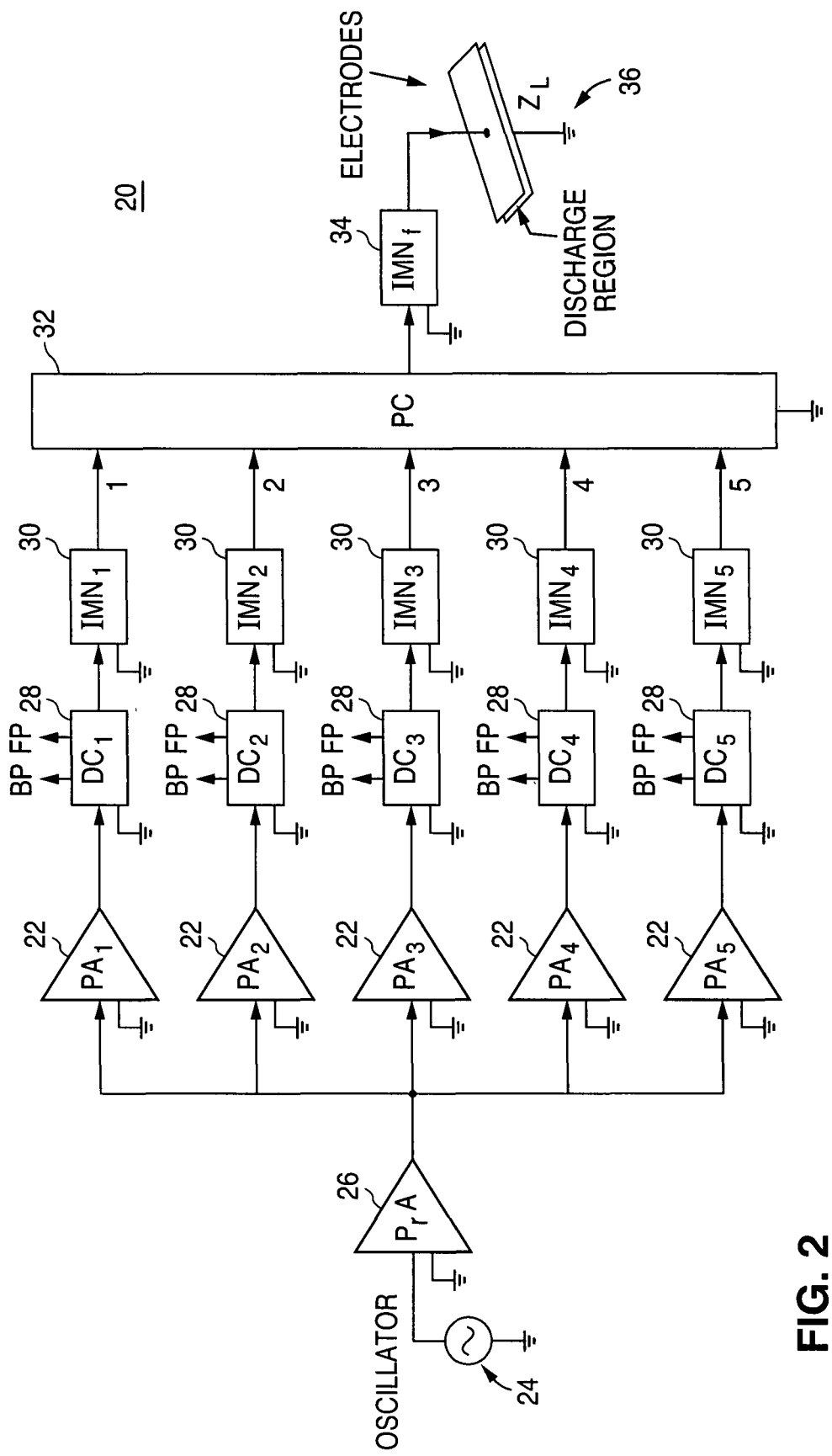
FIG. 2 is a schematic diagram illustrating a solid state RF power supply for driving a $CO_2$ diffusion cooled laser.
Figure 9:
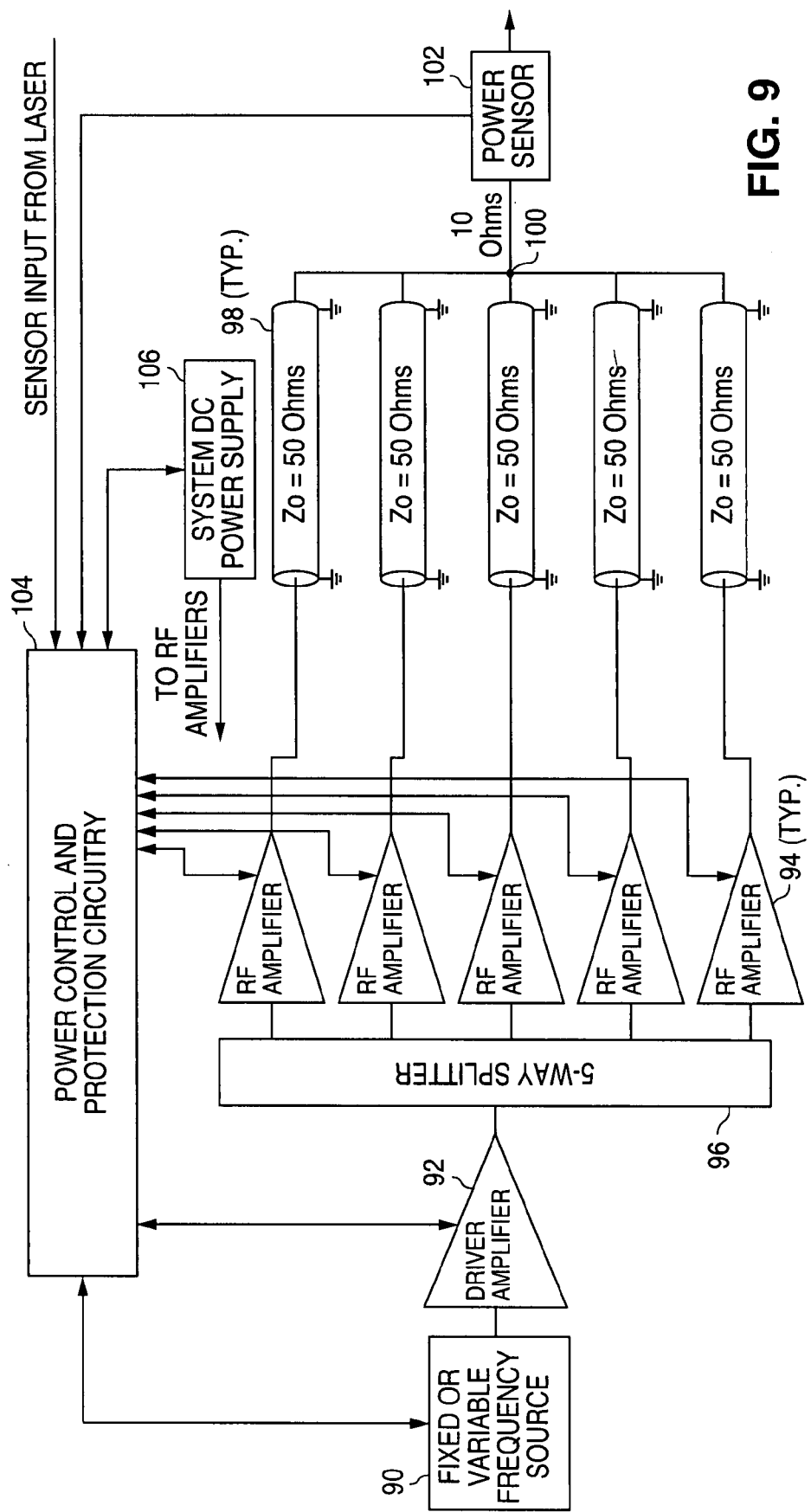
FIG. 9 is a block diagram illustrating a RF power supply using a power combiner driving a $CO_2$ laser discharge in accordance with the present invention.

FIG. 9 presents a more complete diagram of the RF power supply using the low cost, broad bandwidth 5-way power combiner 80 shown in FIG. 7. As shown in FIG. 9, a fixed or variable frequency oscillator 90 is used to set the RF frequency to drive the laser discharge (as also illustrated in FIG. 2). The oscillator signal is fed to a chain of driver amplifiers 92 to increase the power to a level sufficient to drive the five RF power amplifiers 94. The output of the driver amplifier chain is split into five equal amplitude signals, all having the same phase, by the 5-way splitter 96. There are numerous ways to implement this splitter 96 that are well known to those skilled in the art; therefore, details of the splitter 96 are not provided for simplicity. The five signals from the splitter 96 are fed to corresponding individual RF power amplifiers 94. Each of the RF power amplifier outputs is provided to a corresponding separate 50 Ohms co-axial cable 98. All five cables 98 have arbitrary lengths, but they must all be of equal length. The outputs of the five cables 98 are connected to a common point 100. This common RF connection point 100 is also schematically shown in FIG. 8B for bringing the combined RF power from the five cables from the five power amplifier boards to the impedance matching network ($IMN_f$). For simplicity, the five cables are not shown in FIG. 8B. The $IMN_f$ is not shown in FIG. 9. A RF power sensor 102, as is well known in the art, can be used to monitor the power at the common node connection point 100 and provide this information to a power control and protection circuitry subsystem 104, which is also mounted on one of the six printed circuit boards of FIGS. 8A/8B. The output power from the laser tube is monitored by a detector, which is also well known in the art. The power control and protection circuitry subsystem 104 can also receive signals from the oscillator 90, from the output of the driver amplifier 92, from each of the RF power amplifiers 94 by means of directional couplers (shown in FIG. 2), and from a dc power supply 106 that provides dc power to each of the mentioned modules. This enables the power control and protection circuitry subsystem 104 to monitor and provide any correction signal to the modules if unspecified changes occur either in the laser's output power or in the output power of the RF power supply.

As stated above, FIG. 9 shows the FIG. 7 power combiner in the preferred embodiment of a $CO_2$ laser RF power supplied system. It is known to those skilled in the art that protection circuitry may be used to disable the laser system when failure occurs in one or more of the RF amplifiers and for a large back reflection of RF power occurs from the laser discharge. It is also familiar to those skilled in the art that power control may be used to maintain constant laser output power to compensate for power line variation or a degradation of an RF component with the system summarized by FIG. 9.

It is understood that the input impedance of the FIG. 7 power combiner is affected by any power difference that may occur between input ports. The input impedance is also affected by the transmission line length, because the difference (unbalanced power) is phase shifted from the output node back through an additional length of line in order to appear at the inputs. The length of the line may be selected to minimize the change in either phase or magnitude or to set an operating point where neither reaches the maximum change.

Figure 10:
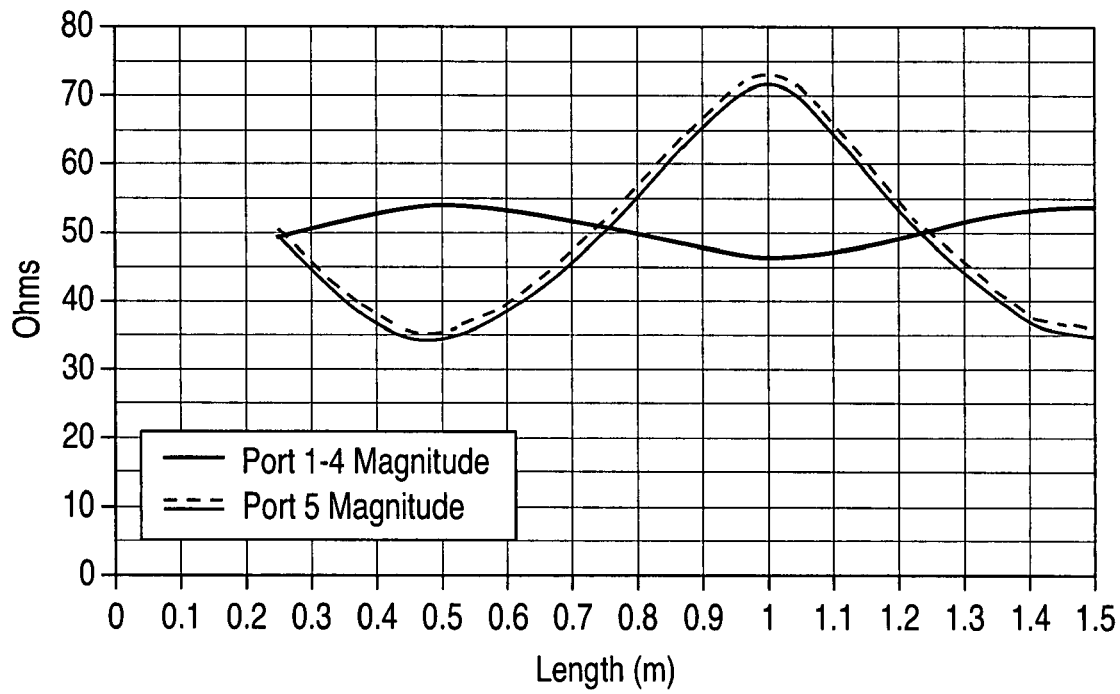
FIG. 10 provides computer simulation data of the operation of a power combiner in accordance with the present invention.
Figure 11:
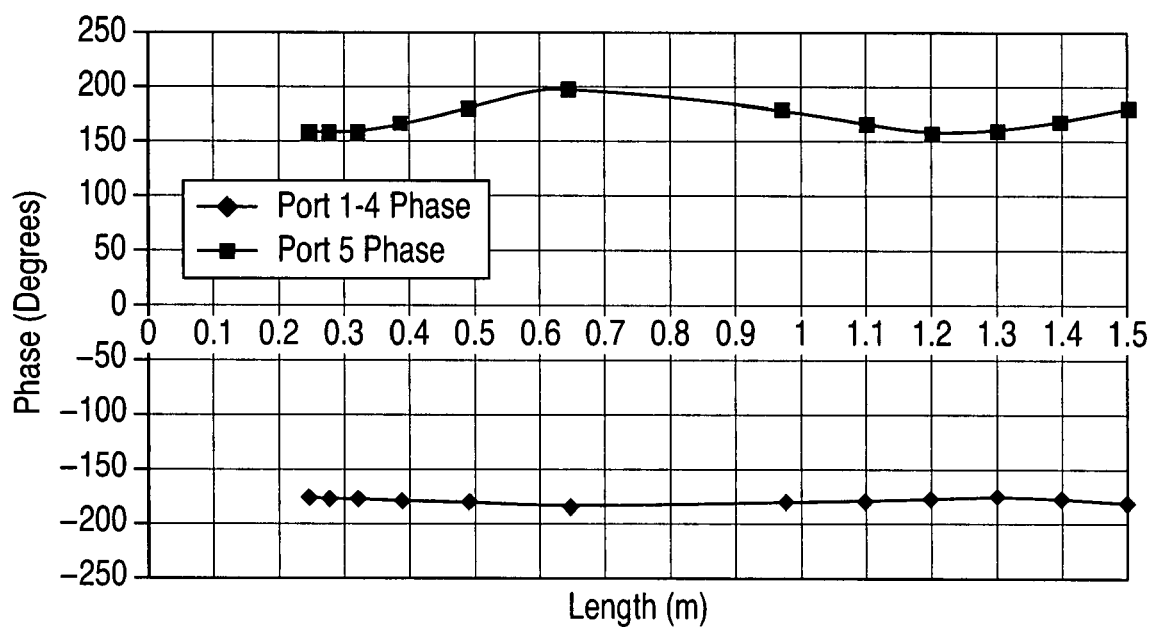
FIG. 11 provides computer simulation data showing the variation in phase angle under the same conditions as FIG. 10 as a function of co-axial cable length.

Such variations as a function of transmission line lengths are shown in FIGS. 10 and 11. FIGS. 10 and 11 illustrate results of a computer simulation of the FIG. 7 5-way power combiner. The plots show data from a combiner operating at 100 MHz and having four of the inputs into each of four transmission lines at 1 kW and 1 input at 650 W into the fifth transmission line. FIG. 10 shows the variation in magnitude of the power amplifier load impedance as the line length (in meters) is changed. The total peak to peak magnitude variation in impedances for ports 1-4 (i.e. the solid line curve) is 7 Ohms compared with 38 Ohms for port 5 (i.e. the dashed line curve). In this example, port 5 is being driven at much lower power (i.e. 650 W) than ports 1-4 (i.e. each at 1 KW) and the imbalance changes the effective impedance experienced by each port. This variation in the input impedance experienced by the four ports when a reduction in power of 35% occurs in the fifth port indicates that the FIG. 7 power combiner can well tolerate such unbalances without damage.

FIG. 11 shows the variation in phase angle experienced by the ports under the same circumstances as for FIG. 10. In this plot, (+) and (−) 180 degrees is the same phase angle. The total peak-to-peak phase variation for ports 1-4 is 8 degrees (i.e. the dark curve) compared with the 24 degrees for port 5 (i.e. the light curve). The analysis illustrated by FIG. 11 shows that minimum phase difference occurs at ¼ wavelength (0.49 meters at 100 MHz) and at ¾ wavelength (approximately 1.5 meters transmission line lengths at 100 MHz). Maximum phase difference occurs at ½ wavelength. Again, such small phase differences experienced by the four ports when a 35% reduction in output power occurs in the fifth port shows that the FIG. 7 power combiner will tolerate such unbalances without damage.

Similar results as for FIGS. 10 and 11 were obtained when port 1 was assumed to put out 245 Volts at 1200 W, with ports 2, 4, and 5 putting out 234 Volts at 1100 W, and with port 3 putting out 223 Volts at 1000 W output. Input voltage and current variations as a function of transmission line lengths were calculated. The analysis again indicated that the variations in phase, impedance, voltage, and current calculated under the stated conditions emitted by the power amplifiers were acceptable.

The power amplifiers the output of which are to be combined must be designed to accept the variation in impedance without causing additional failures. RF power supplies used to drive $CO_2$ lasers operating in a pulsed mode at less than 100% duty cycle generally have this degree of robustness.

The computer simulations discussed above show that the FIG. 7 power combiner is sufficiently robust in tolerating imbalances between power amplifiers outputs that it can be used in RF power supplies, e.g., as illustrated in FIGS. 8 and 9, to drive medium output power (i.e. several hundred to 1000 W) diffusion cooled $CO_2$ slab laser that have much lower impedances than 50 Ohms. The power combiners illustrated in FIGS. 5 and 6 have superior imbalance protection, but such protection comes at high cost than that of the FIG. 7 embodiment.

The FIG. 7 power combiner has an isolation between transistor amplifiers of −6 dB, while the modified Wilkinson power combiner of FIG. 6 is around −20 dB at its center frequency. The center frequency is determined by the length of the ¼ wavelength transmission lines. The isolation between transistors degrades rapidly on either side of the center frequency. Since the FIG. 7 power combiner does not require ¼ wavelength lines, there is, therefore, no center frequency so that the isolation between transistors stays constant over a wide band width. The −6 dB isolation between transistors is small in comparison to the −20 dB of the Wilkinson combiner of FIG. 6. In the case of pulsed laser discharges applications, if the RF power drops to a given low level the laser stops working and needs to be serviced. This low level is determined by the gas pressure, the performance of the pre-ionizer, the separation between the electrodes, operating temperature, changes in the gas mixture, etc. Once this low level is reached, it becomes difficult to re-ignite the discharge, so there is no choice but to repair the laser power supply. The analysis shown in FIGS. 10 and 11 indicates that there is sufficient soft degradation in the FIG. 7 combiner to satisfy the needs that driving laser discharges requires.

It is important to again note that the inventions shown in FIGS. 5, 6 and 7 are not limited to impedances of lower than 50-Ohms inputs. Power amplifiers can be produced with many useful output impedances and there are many difference impedances for coaxial cable and transformers to match power amplifier impedances. PC subsystems could be designed to take advantage of the FIG. 7 combiner, as well as the modified binary (FIG. 5) and the Wilkinson (FIG. 6) combiners, to handle impedances of a few Ohms to a few hundred Ohms, i.e. $CO_2$ lasers having output powers in the Kilowatt to the tens of watts range, respectfully. This impedance range can be accommodated by numerous means, such as changing the number of ports, changing the characteristic impedance of the transmission lines, changing the step-up/step-down transformer ratios, etc. The availability of co-axial cable impedances (for FIGS. 6 and 7) and transformer ratios (for FIG. 5) would set the impedance range limit over which the combiner can be used. The general principles of the FIG. 7 combiner can be used in systems that operate from a few Hertz up into the microwave limit (i.e. GHz). The next widest bandwidth combiner is the FIG. 5 embodiment. The narrowest band width combiner is the FIG. 6 embodiment.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents

What is claimed is:

1. A binary power combiner circuit comprising:
a first transformer that combines an output received from a first power amplifier and an output received from a second power amplifier to provide a first transformer output;
a first difference resistor connected between the output of the first power amplifier and the output of the second power amplifier;
a second transformer that combines an output received from a third power amplifier and an output received from a fourth power amplifier to provide a second transformer output;
a second difference resistor connected between the output of the third power amplifier and the output of the fourth power amplifier;
a third difference resistor connected between the first transformer output and the second transformer output; and
a third transformer connected to combine the first transformer output and the second transformer output to provide a third transformer output directly to a load.

2. A 4-way binary power combiner consisting of:
a first 1:1 transformer that combines a 50 Ohm output impedance received from an output of a first power amplifier and a 50 Ohm output impedance received from an output of second power amplifier to provide a 25 Ohm first transformer output impedance at a first transformer output;
a first 100 Ohm difference resistor connected between the first power amplifier output and the second amplifier output;
a second 1:1 transformer that combines a 50 Ohm output impedance received from an output of a third power amplifier and a 50 Ohm output impedance received from an output of a fourth power amplifier to provide a 25 Ohm second transformer output impedance at a second transformer output;
a second 100 Ohm difference resistor connected between the third power amplifier output and the fourth power amplifier output;
a 50 Ohm difference resistor connected between the first transformer output and the second transformer output; and
a third transformer that combines the 25 Ohm first transformer output impedance and the 25 ohm second transformer output impedance to provide a 12.5 Ohm output impedance at a third transformer output, the third transformer output adapted for direct connection to a load.

3. A 4-way binary power combiner as in claim 2, and wherein the load comprises an impedance matching network that provides an output to a laser.

4. A modified Wilkinson power combiner comprising:
a plurality of one-quarter wavelength transmission lines having equal length and equal characteristic impedance, each of said transmission lines having an input end connected to receive an output impedance from an output of an associated power amplifier, each of said transmission lines further having an output end that is connected to a common transmission line output connection point; and
for each of said transmission lines, a difference resistor connected between the input end of said transmission line and a common difference resistor connection point, and wherein the common transmission line output connection point is adapted for direct connection to a load.

5. A modified 4-way Wilkinson power combiner consisting of:
first, second, third and fourth one-quarter wavelength co-axial transmission lines having equal length and 50 ohm characteristic impedance, each of said co-axial transmission lines having an inner conductor having an input end and an output end and an outer conductor, the input end of the inner conductor adapted to receive a 50 Ohm output impedance from an output of an associated power amplifier, the output end of the inner conductor being connected to a common transmission line output connection point that receives a 12.5 Ohm output impedance, the outer conductor being connected to ground; and
for each of said co-axial transmission lines, a 50 Ohm difference resistor connected between the inner conductor of said co-axial transmission line and a common difference resistor connection point, and wherein the common transmission line output connection point is adapted for direct connection to a load.

6. A modified 4-way Wilkinson power combiner as in claim 5, and wherein the load comprises an impedance matching network that provides an output impedance to a laser.

7. A power combiner for combining an RF output of a plurality of power amplifiers and supplying a combined output to an electrode of a gas discharge laser, said gas discharge laser having an ignition frequency and an operating frequency, different from the ignition frequency:

a plurality of continuously uninterrupted transmission lines having equal length and equal characteristic impedance, each of said transmission lines having a conductor having
an input end receiving a power amplifier output impedance from an associated power amplifier and
an output end that is connected to a common connection point that receives a transmission line output impedance, wherein the plurality of transmission lines have a bandwidth sufficient to operate at both the ignition frequency and the operating frequency.

* * * * *